US008352203B2

(12) United States Patent
Seibel et al.

(10) Patent No.: US 8,352,203 B2
(45) Date of Patent: Jan. 8, 2013

(54) DIGITAL IMPLEMENTATION OF A TRACKING FILTER

(75) Inventors: Brian J. Seibel, Grafton, WI (US); Russel J. Kerkman, Milwaukee, WI (US); Carlos Daniel Rodriguez-Valdez, Glendale, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 440 days.

(21) Appl. No.: 12/627,400

(22) Filed: Nov. 30, 2009

(65) Prior Publication Data

US 2011/0130993 A1   Jun. 2, 2011

(51) Int. Cl.
*G01R 23/00* (2006.01)
(52) U.S. Cl. .......................................................... 702/75
(58) Field of Classification Search .................. 702/75
See application file for complete search history.

(56) References Cited

U.S. PATENT DOCUMENTS

| | | | | |
|---|---|---|---|---|
| 4,015,262 A | * | 3/1977 | Etcheverry et al. | 342/396 |
| 5,445,028 A | * | 8/1995 | Bianchi et al. | 73/593 |
| 5,617,480 A | * | 4/1997 | Ballard et al. | 381/98 |

OTHER PUBLICATIONS

Herlufsen, Henrick et al.; "Characteristics of the Vold/Kalman Order Tracking Filter"; based on a paper presented at teh 17th International Modal Analysis Conference, Kissimmee, FL., Feb. 1999; Sound and Vibration/Apr. 1999; pp. 2-8.
Rao, Ashwin et al.; "Dynamic Tracking Filters for Decomposing Nonstationary Sinusoidal Signals"; Department of Electrical Engineering; The University of Rhode Island, IEEE Xplore, downloaded on Oct. 9, 2008; pp. 917-920.
Su, Weizhou et al.; Fundamental Performance Limitations in Tracking Sinusoidal Signals; Department of Electrical Engineering, University of California; Proceedings of the American Control Conference, Denver, Colorado Jun. 4-6, 2003; IEEE Xplore, downloaded on Oct. 9, 2008; pp. 5335-5340.
Zollo, Steven et al.; "On Polar Versus Cartesian Coordinates for Target Tracking"; 5th ISSPA '99, Brisbane, Australia, Aug. 22-25, 1999; Signal Processign Research Centre, QUT, Bisbane, Australia, IEEE Xplore, downloaded on Oct. 9, 2008; pp. 499-502.
Purnahagen, Heiko; "Parameter Estimation and Tracking for Time-Varying Sinusoids"; Laboratorium fur Informationstechologie, University of Hannover, Germany; 1st IEEE Benelux Workshop on Model based Processing and Coding of Audio (MPCA-20020, Leuven, Belgium, Nov. 15, 2002; pp. 5-8.
Bustamante, Luis G.; "High-Range Switched-Capacitor Tracking Filter"; Department of Electrical & Computer Engineering, Oklahoma State University; IEEE Xplore, downloaded on Oct. 9, 2008, pp. II-65-II68.

* cited by examiner

*Primary Examiner* — Aditya Bhat
(74) *Attorney, Agent, or Firm* — Fletcher Yoder, P.C.; Alexander R. Kuszewski; John M. Miller

(57) ABSTRACT

Methods and systems for tracking an electronic signal corresponding to an operating frequency of an electronic component are provided. A method may include sampling the signal to determine previous and current time samples of the signal. A frequency of interest in the signal may also be pre-warped to decrease adverse warping effects resulting from processing signals having relatively higher operating frequencies. The previous and current time samples of the signals, along with the pre-warped frequency of interest, may be input into a digital tracking filter. The digital tracking filter may be configured to execute one or more algorithms on the previous and current time samples and the pre-warped frequency of interest to estimate a current operating frequency.

10 Claims, 5 Drawing Sheets

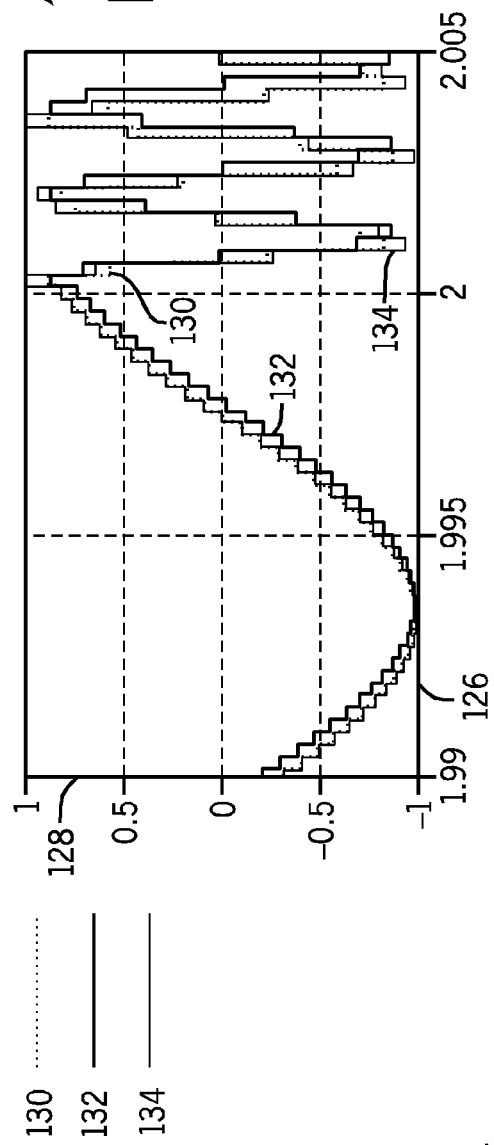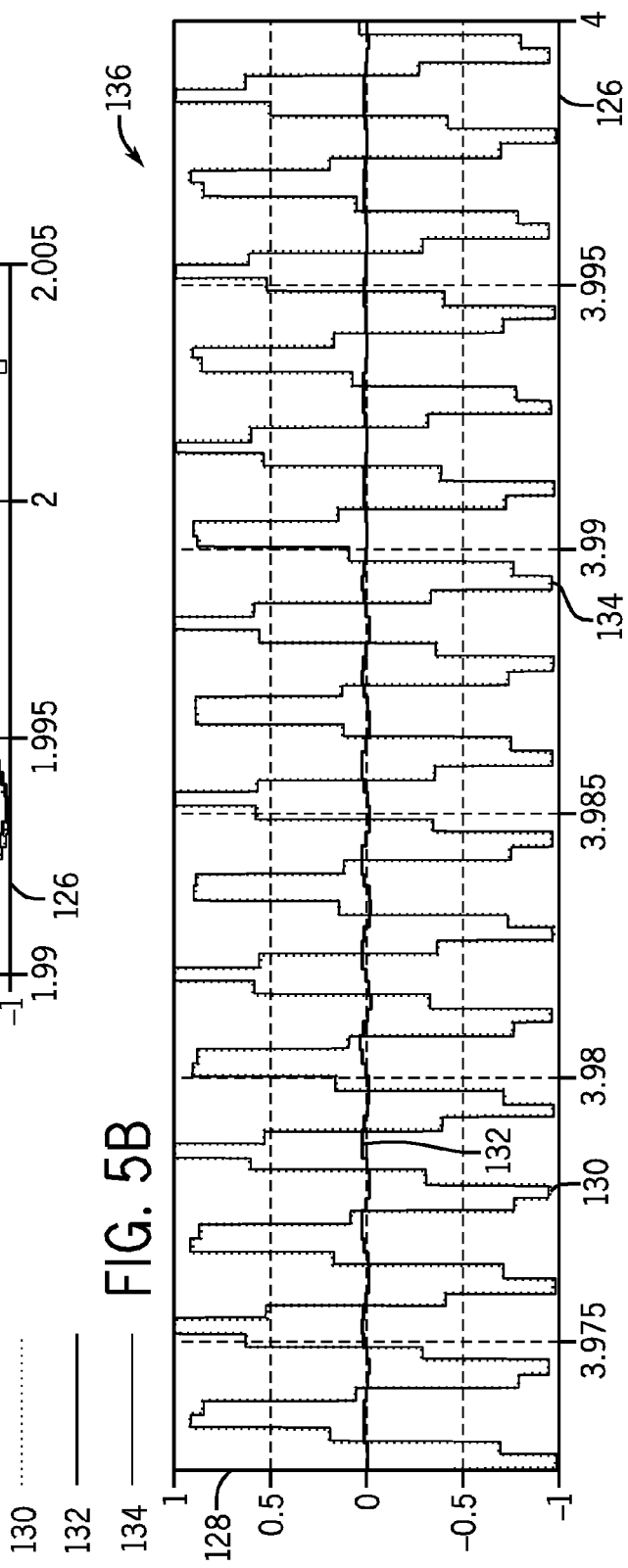

DIGITAL IMPLEMENTATION OF A TRACKING FILTER

BACKGROUND

The invention relates generally to signal processing, and more specifically, to filtering techniques for electronic signals.

Various electronic systems including electric drives or motors may operate by converting electric energy into mechanical energy. An electronic system may operate at one or more operating frequencies, or cycles of a mechanical motion per second. The electronic system may track each operating frequency to determine a condition of the system. Changes in an operating frequency, or deviations from an appropriate range of an operating frequency, may indicate that a drive in the system is not operating normally. For example, mechanical parts may be subjected to general wear and tear during their lifetime. Further, parts of an electronic system may be subjected to abnormal conditions which affect the operation of the system. As a result, the components of the electronic system may eventually fail, which may lead to faults and/or inefficient operation of the electronic system.

Some electronic systems may be configured to detect changes in the operating frequencies in the system. Detection of such changes in operation may alert an operator of the system that a part may need repair or attention, or that the system is not operating efficiently. For example, the electronic system may determine that a particular drive in the system is operating at less than an appropriate operating frequency, and may be in need of repair or replacement.

Generally, filters may be used to determine and/or separate certain frequency bands in a signal, and may be used to detect conditions in an electronic system by determining one or more operating frequencies in the system. In some electronic systems, the frequency components may vary within a relatively wide range, and static filtering techniques may be inefficient in detecting whether a varying operating frequency remains in an acceptable range. For example, electric drives such as motors or generators may have constantly changing rotational speeds, and a static filter may not be configured to identify when the operating frequency is in a normal or abnormal range. Thus, electronic systems may benefit from a filtering method adapted to distinguish and/or track one or more operating frequencies dynamically.

BRIEF DESCRIPTION

One embodiment relates to a method for tracking a parameter of interest within a frequency of interest. The method includes periodically sampling the values of the parameter of interest to obtain a sampled value for a current time step, as well as a sampled value for a previous time step. Obtaining the sampled values and the combination of sampled values may be based on a known current operating frequency and a known time step duration, and may determine the parameter of interest.

Another embodiment includes a method for tracking an operating frequency of an input signal. The method may be largely performed by a processor in an electronic system, and may include receiving an input signal corresponding to an operation of a device in the system. The method may then include pre-warping a frequency in the input signal and digitizing the input signal to determine a previous time sample and a current time sample of the digitized input signal. The method may then include executing one or more algorithms using the pre-warped frequency of interest, the previous time sample, and the current time sample to output an estimate of the signal at the operating frequency.

In another implementation, an electronic system is provided. The electronic system includes a processor configured to provide an electronic signal corresponding to an operation of a component in the system. For example, the signal may be an analog signal generated in response to motion of the component. The processor may also be configured to sample the signal to obtain a previous time sample and a current time sample of the reference, and also to pre-warp a frequency of interest in the signal. The frequency of interest may be based on a known operating frequency of the component. The processor may further be configured to estimate the signal at the operating frequency based on the pre-warped frequency of interest, the previous time sample, and the current time sample.

DRAWINGS

These and other features, aspects, and advantages of the present invention will become better understood when the following detailed description is read with reference to the accompanying drawings in which like characters represent like parts throughout the drawings, wherein:

FIGS. 5A and 5B are graphs depicting the digital tracking of an electronic signal, where estimates are made without pre-warping, and with pre-warping.

DETAILED DESCRIPTION

Electronic systems may often be configured to monitor one or more operating frequencies of components (e.g., drives, motors, etc.) in the system. Monitoring the operating frequencies of system components may enable the detection of a component not operating at an appropriate frequency, which may indicate that the component is in need of attention and/or the system is not operating efficiently. The components of an electronic system may typically operate at varying frequencies, and such operating frequencies may not be known in advance. To track and/or monitor a signal at the frequency of interest when the frequency may vary and/or may be unknown, filtering methods may be adapted to determine the value of a frequency dynamically (e.g., track the value of an operating frequency in a signal even when the operating frequency is constantly changing). The present techniques include methods of digitally tracking electronic signals given a reference frequency input in an electronic system. A frequency component in an electronic system may be determined even when the system is operating at relatively high frequencies. Furthermore, while the filtering of motor drives may be used as one example of an application for the present techniques, embodiments of the present techniques may apply for any electronic signal.

Figure 1:
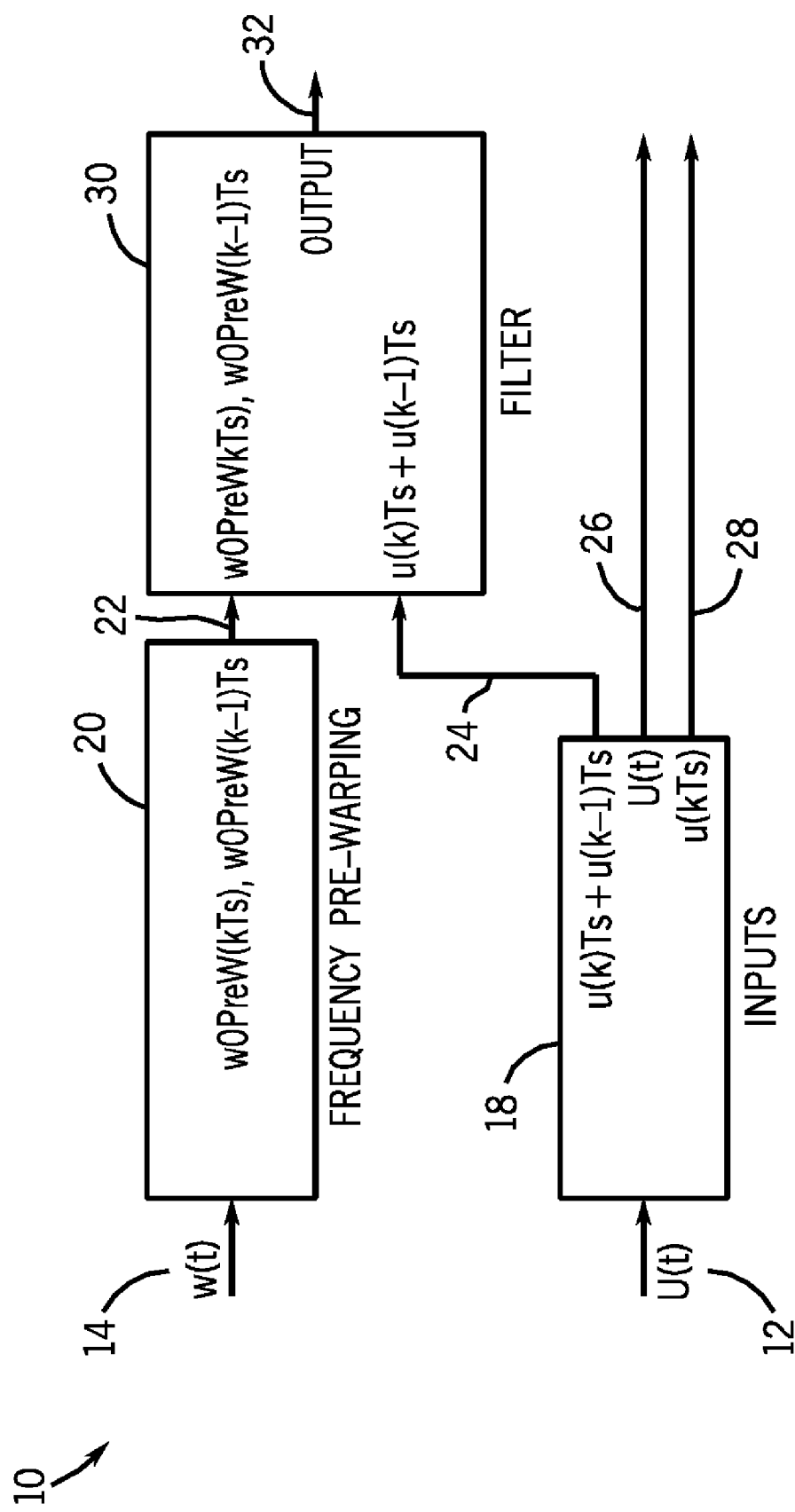
FIG. 1 is a block diagram illustrating an overview of a digital tracking filter, in accordance with one embodiment of the present techniques.

Turning now to the figures, FIG. 1 illustrates an overview of a process 10 for tracking the operating frequency of an electronic system component. Components and/or circuitry involved in the process 10 of FIG. 1 include an input integrator circuit 18, a frequency pre-warping circuit 20, and a tracking filter 30, which are illustrated in further detail in FIGS. 2-4, respectively. Beginning first with FIG. 1, the process 10 depicts one embodiment of a technique for tracking the operating frequency of a component in an electronic system. The signal u(t) 12 may be any signal having the desired frequency component. The frequency component may be set by the frequency input w(t) 14, which may be a signal having the frequency to be tracked in the signal u(t) 12. In one embodiment, the signal w(t) 14 may be may represent a rate at which an electric system component is operating (e.g., based on cycles of motion), and the process 10 may be configured to track a frequency component of the signal u(t) 12 based on the frequency input w(t) 14.

In one embodiment, the signal 12 and the frequency input signal 14 may be analog signals corresponding to a continuous operation of the electric system component. The signal 12 may be sent through circuit 18 configured to output amplified, discretized, and time delayed signals of the signal 12.

Certain electrical systems may include components with high operating frequencies. When processing a high frequency signal, frequency warping may occur, which may result in aliasing or distortion of an input signal and reduce the ability to properly track a frequency component in the signal. To accommodate for frequency warping when input signals 12 and/or 14 have high frequencies, the process 10 may also include a frequency pre-warping circuit 20 configured to pre-warp the input frequency signal 14. Thus, a pre-warped input signal 22 may be transmitted to a tracking filter 30, such that the negative effects of warping (e.g., aliasing, distortion) which occurs in the filtering of a high-frequency signal may be decreased, and the tracking filter 30 may more accurately determine the value of the center frequency component of the input signal. The input integrator circuit 18 may also output a time delayed signal 24 into the tracking filter 30. As will be later discussed, the tracking filter 30 may make a digitized estimation of the frequency component in the signal u(t) 12 as an output 32 to the electronic system.

Furthermore, the input integrator circuit 18 may also output a discretized signal 28. The discretized signal 28 may be a sampled value of the signal u(t) 12, which is represented as a continuous signal 26 from the input integrator circuit 18. The digitized estimation output 32 from the tracking filter 30, the continuous signal 26, and/or the discretized signal 28 may be provided to other components in an electronic system, such as to a processor, which may analyze each signal or compare the signals to determine a condition of the operating frequency. For example, the digitized estimate output 32 from the tracking filter 30 may enable an electrical system (e.g., the processor) to track changes in the signal of the component being monitored. As discussed, the operating frequency of an electrical system component, such as a motor or a drive, may vary throughout the operation of the system. By monitoring or analyzing the signal component at the output 32, the system 38 may determine a certain condition about the component being tracked.

Figure 2:
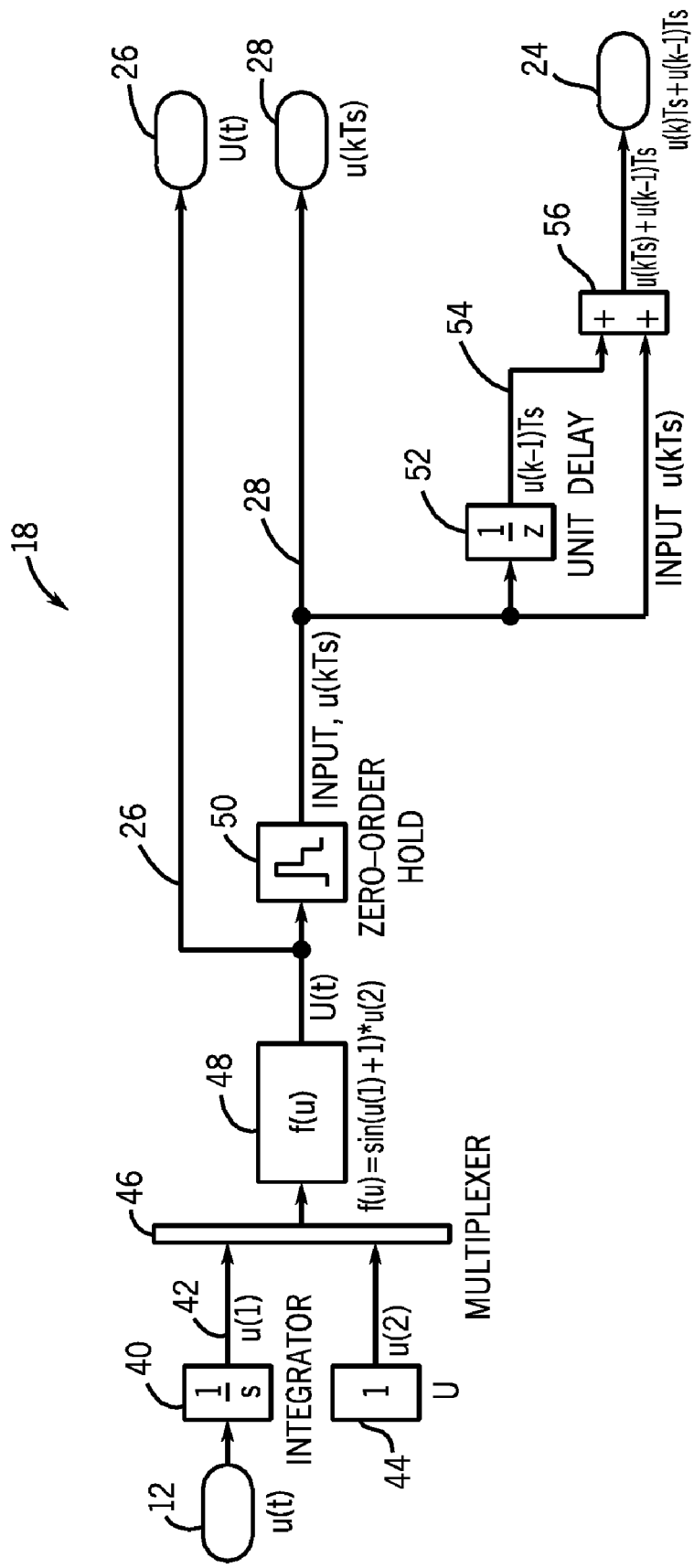
FIG. 2 is a block diagram representing how a signal may be input into a tracking filter of FIG. 1.
Figure 3:
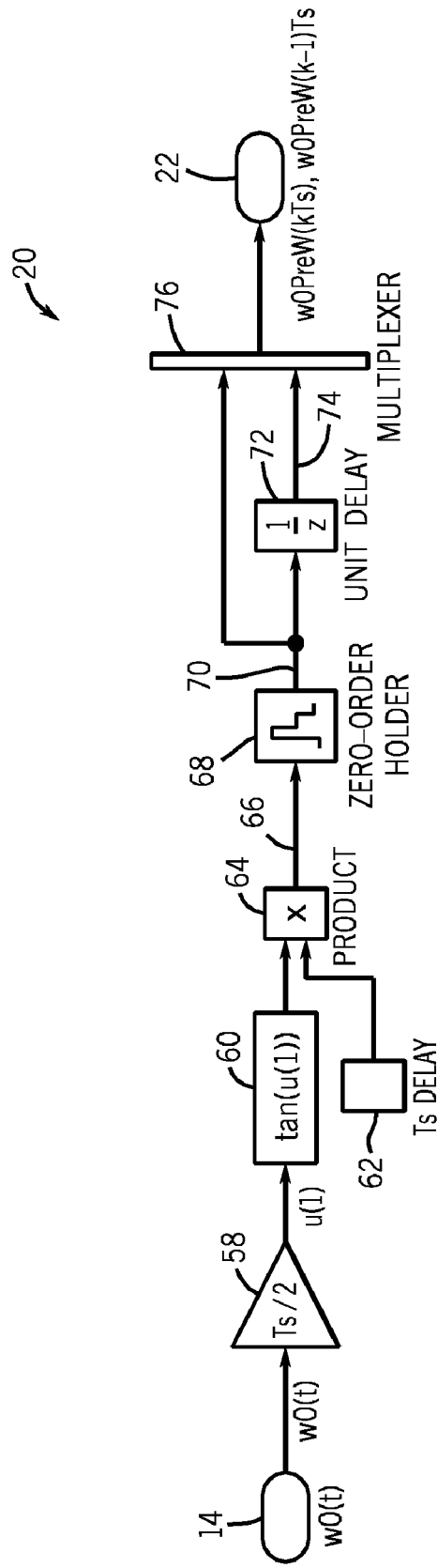
FIG. 3 is a block diagram representing a pre-warping function in the tracking filter of FIG. 1.

The input integrator circuit 18 of the process 10 (from FIG. 1) is depicted in FIG. 2. The input frequency signal 14 may be transmitted to an integrator 40 which integrates the signal 14 over time. The integral 42 may be amplified by multiplexing (e.g., via a multiplexer 46) with a constant value 44 to circuitry 48 configured to change the amplitude of the integrated input 42. A function used to modify the amplitude of the input 42 may be any signal. One example of a function which enables the amplitude of the input 42 to be changed by varying the constant 44 may be represented as f(u)=sin(u(1))*u (2), where u(1) represents the integral 42 of the input signal 14, and where u(2) represents the variable constant 44. In some embodiments, the variable constant 44 may be changed depending on the application, or depending on the characteristics of the frequency to be tracked. Thus, one output 26 from the circuitry 48 may be an amplified input signal 26.

The amplified input signal 26, which may be from any source in addition to that described, may also be directed to a zero order hold 50, which discretizes (e.g., samples) the continuous amplified input signal 26 to output a discrete signal 28. The discrete sample 28 may also be transmitted to a unit delay circuit 52. In one embodiment, the unit delay circuit 52 may include one or more delay units configured to receive the current sample of the input signal 28 and generate a delay time by one sample time T to output a previous sample in time 54. The unit delay may be represented by u(K−1)T, where the K−1 represents a previous sample number of the current sample number K. The previous sample 54 may be added with the current sample 28, represented as u(KT) in the adder 56 to output a signal 24 having the previous and the current sample. This time delayed input signal 24, having the previous and current samples, may be represented by u(KT)+u(K−1)T. Thus, in one embodiment, the input integrator circuit 18 may output a continuous signal 26 which may be amplified according to a variable constant 44. The input integrator circuit 18 may also output a discrete, sampled input signal 28, as well as a time delayed input signal 24. As will be later discussed, the time delayed input signal 24 may be used in the tracking filter 30 to track the signal at the operating frequency of an electronic system component based on current and previous frequency values. The continuous and amplified input signal 26 and the discrete input signal 28, including the current sample, may be output by the input integrator circuit 18 such that the electronic system 38 (e.g., a processor in the system 38) may use the signals for further analyses and/or processing to evaluate an estimate of the operating frequency of the electronic system component.

As discussed, electronic systems may often include components which operate at high frequencies. Signal processing of high frequency signals may sometimes result in frequency warping of the signal. Thus, when filtering a digitized signal, warping may result in aliasing and/or distortion, which may affect the accuracy of estimating the value of the center frequency component (e.g., an operating frequency) of the input signal. One method of preventing the negative effects of signal warping may be to compensate for possible warping by first pre-warping an input signal before processing the input signal. A continuous time circuit design may be configured to pre-warp a signal to compensate for frequency warping, and may be represented by the equation below:

$$\omega_a = \frac{2}{T_s}\tan\left(\omega\frac{T_s}{2}\right) \qquad \text{eq. (1)}$$

In eq. (1), the continuous time filter frequency $\omega_a$ corresponds to the discrete time filter frequency $\omega$. In one embodiment, the input frequency signal 14 (as in FIG. 1) may be pre-warped by the frequency pre-warping circuit 20 in FIG. 3, which may correspond to the operation described by eq. (1). The frequency of the input frequency signal 14 $\omega_0(t)$ may first be multiplied by $T_s/2$, or half the sampling period, such that the $\tan(\omega T_s/2)$ may be taken in block 60. An input of $2/T_s$ 62 may be multiplied in block 64 by $\tan(\omega T_s/2)$ to produce the pre-warped frequency 66. The pre-warped frequency may then be discretized by the zero order hold 68. In some embodiments, the pre-warped frequency may already be discrete. The discrete pre-warped frequency 70 may be sent to a multiplexer 76, along with a previous sample of the discrete pre-warped frequency 74, which may have been delayed by the unit delay circuit 72. The multiplexer 76 may output the current and the previous pre-warped frequencies 22 in digital form.

The pre-warping circuitry 20 may thus output pre-warped signals 22 to the tracking filter 30. In one embodiment, the tracking filter 30 may digitally extract the frequency component corresponding to the frequency of the input frequency signal 14, such that the extracted (e.g., tracked) frequency component may be mapped into a discrete time system. The input frequency signal 14 may also be pre-warped to compensate for frequency warping which may occur in filtering of high frequency signals.

Figure 4:
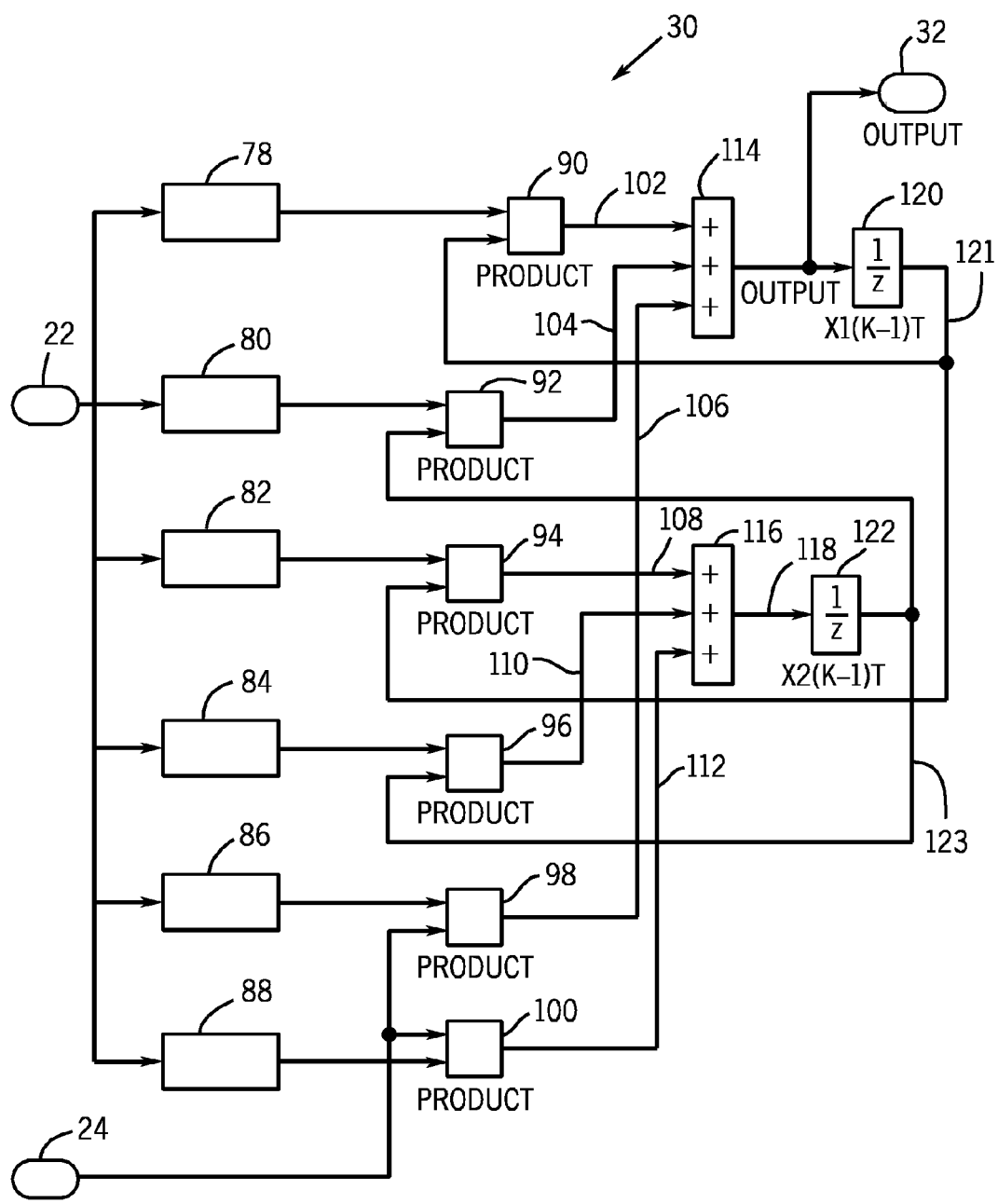
FIG. 4 is a diagram representing a tracking filter function.

The pre-warped frequency signals 22 may be input into the tracking filter 30, as generally depicted in FIG. 1 and further detailed in FIG. 4. Also input into the digital tracking filter 30 is the time delayed input signal 24, having both the previous and current samples of the discrete input signal 28, which is output from the input integrator circuit 18. The tracking filter 30 may involve algorithms which band-pass filter the digitized input 24 to filter at a center frequency of interest, and/or within a bandwidth a. The frequencies passed by the tracking filter 30 may be a range which encompasses the operating frequency of the electronic system component that is being monitored in the process 10 (as in FIG. 1). The bandwidth a may be selected during the design of the tracking filter 30, or alternatively, the bandwidth a may be selected during the operation of the system 38, and may be altered depending on the applications of the system 38 or the frequencies to be tracked. For example, the bandwidth a may be selected to be two times the expected operating frequency of the electronic system component monitored in the process 10, or three times the expected operating frequency for detecting conditions such as ground faults.

In one embodiment, the tracking filter 30 may be configured to execute algorithms based on the equation below:

$$\begin{bmatrix} x_1(KT) \\ x_2(KT) \end{bmatrix} = A \begin{bmatrix} x_1(K-1)T \\ x_2(K-1)T \end{bmatrix} + B[u(KT) + u(K-1)T] \quad \text{eq. (2)}$$

where K represents a current frequency sample, T represents the sampling time, $x_1(KT)$ represents the current estimate of the operating frequency 32, and $x_1(K-1)T$ represents a previous estimate of the operating frequency. The previous estimate may be used to determine a current estimate 32. Matrix A may be a 2×2 matrix, and matrix B may be a 2×1 matrix, both defined below:

$$A = \frac{1}{1+\frac{T}{2}a+\left(\frac{T}{2}\omega_0(KT)\right)^2} \begin{bmatrix} 1 & -\frac{T}{2}\omega_0(KT) \\ \frac{T}{2}\omega_0(KT) & 1+\frac{T}{2}a \end{bmatrix}$$

$$\begin{bmatrix} 1-\frac{T}{2}a & -\frac{T}{2}\omega_0(K-1)T \\ \frac{T}{2}\omega_0(K-1)T & 1 \end{bmatrix}$$

$$B = \frac{1}{1+\frac{2}{aT}+\frac{T}{2a}(\omega_0(KT))^2} \begin{bmatrix} 1 \\ \frac{T}{2}\omega_0(KT) \end{bmatrix} \quad \text{eq. (4)}$$

The pre-warped input signal 22 may provide the input functions 78, 80, 82, 84, 86, and 88, which include both a current and a previous time sample of the input signal. More specifically, each of the functions 78, 80, 82, and 84 may represent a value in matrix A, and each of the functions 86 and 88 may represent a value in matrix B. Further, u(KT)+u(K−1)T from eq. (2) may be obtained by the time delayed input signal 24 output from the input integrator circuit 18.

The multiplication of matrix A by previous time sample estimates 121 and 123 may be performed in blocks 90, 92, 94, and 96 where the previous estimates 121 and 123 are output by the unit delay circuits 120 and 122. The unit delay circuits 120 and 122 may be used for cross coupling, such that the time delayed estimates 121 and 123 of the outputs $x_1(KT)$ 32 and $x_2(KT)$ 118 may be sent back to blocks 90, 92, 94, or 96 to complete the matrix multiplication between matrix A and the previous time estimates and matrix B with the input signal 24.

To obtain the output $x_1(KT)$ 32, the tracking filter 30 may add the products 102 104, and 106. Product 102 may be a product (from block 90) of function 78, the $a_{11}$ position of matrix A, and the time sample estimate 124. Product 104 may be a product (from block 92) of function 80, the $a_{12}$ position of matrix A, and the time sample estimate 126. Product 106 may be a product (from block 98) of function 86, the $b_1$ position of matrix B, and the input 24, u(KT)+u(K−1)T. The products 102, 104, and 106 may be summed in block 114 to produce the output $x_1(KT)$ 32.

To obtain the output $x_2(KT)$ 118, the tracking filter 30 may add the products 108 110, and 112. Product 108 may be a product (from block 94) of function 82, the $a_{21}$ position of matrix A, and the time sample estimate 124. Product 110 may be a product (from block 96) of function 84, the $a_{22}$ position of matrix A, and the time sample estimate 126. Product 112 may be a product (from block 100) of function 88, the $b_2$ position of matrix B, and the input 24, u(KT)+u(K−1)T. The products 108 110, and 112 may be summed in block 116 to produce the output $x_2(KT)$ 118. The output $x_1(KT)$ 32 may be an estimate of a current operating frequency of a component that is being monitored by the electronic system 38 via the process 10.

As discussed, the bandwidth value a may be selected at various stages, including during the hardware design of the filter 30, or anytime during the operation of the electronic system 38 comprising the filter 30. Furthermore, an electronic system 38 may have several filters 30 each running in parallel, or a system 38 may have one or more filters 30 which perform sequential frequency tracking at different bandwidth values. For example, a tracking filter 30 may operate for some amount of time using one bandwidth $a_1$, and then operate for another amount of time using a second bandwidth $a_2$. The angular frequency $\omega_0$ may also be selected based on the electronic system 38 and/or based on the application or the operating frequency of the system component that is being monitored by the process 10.

One example of a result of the tracking filter 30 in the process 10 may be depicted in the graph 124 of FIGS. 5A and 5B. The graph 124 of FIG. 5A, which displays amplitude (e.g., current, voltage, etc.) 128 over time 126, plots an input signal 130 for a tracking filter, a digital estimate of a tracking filter without pre-warping the signal, shown as line 132, and a digital estimate of a tracking filter with pre-warping, shown as line 134. The input signal 130 may correspond to an operating frequency of a component in an electronic system 38. In the graph 124, during the time before 2 seconds, the frequency is set to 60 Hz. At this relatively low frequency, pre-warping may not produce a substantially different estimate from not pre-warping, as each of the input signal 130, the filtered estimate without pre-warping 132, and the filtered estimate with pre-warping 134 may be substantially similar. However, in high frequencies, pre-warping an input signal may result in a more accurate digital estimate. For example, after 2 seconds, the frequency is set to 600 Hz. At this relatively high frequency, the estimate with pre-warping 134 may be substantially more accurate (e.g., closer to the input signal 130) than the estimate without pre-warping 132. Furthermore, as depicted in the graph 136 of FIG. 5B, a tracking filter estimate without pre-warping 132 may degrade in accuracy over time, while the tracking filter estimate with pre-warping 134 remains substantially similar to the input signal 130.

Furthermore, in some embodiments, varying the bandwidth a or the sampling time T of the tracking filter 30 may result in high resolution tracking, which may improve the accuracy of the digital estimate 132. As seen in the graph 124, the digital estimate 132 follows the waveform of the input signal 130, such that signal peaks may be estimated, resulting in a substantially dynamic tracking of the frequency of the input signal 130.

Thus, the present techniques may result in the substantially dynamic tracking of any signal to estimate the operating frequency of a component in an electronic system. As discussed, monitoring the operating frequency of a component, such as a motor or a drive, may enable the electronic system to determine conditions in the system based on changes or deviations in the operating frequency, including where or when a failure in the system has occurred.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for tracking a frequency of operation of an electrical component within an electrical system using a processor, comprising:
   periodically sampling a signal from the electrical system with an input integrator, the signal having the frequency embedded therein;
   combining sampled values of the signal for a previous time step with sampled values of the signal for a current time step with the input integrator; and
   determining the frequency of the electrical component with a tracking filter based at least in part on the combined sampled values of the signal and a reference signal from a second electrical component associated with the electrical system.

2. The method of claim 1, comprising combining the sampled values of the signal with a previous estimated value of the reference signal to determine a current value of the frequency.

3. The method of claim 1, wherein combining sampled values of the signal comprises determining values in accordance with the relationship:

$$\begin{bmatrix} x_1(KT) \\ x_2(KT) \end{bmatrix} = A \begin{bmatrix} x_1(K-1)T \\ x_2(K-1)T \end{bmatrix} + B[u(KT) + u(K-1)T]$$

wherein K represents a current sample of the signal, T represents a sampling time, $x_1(KT)$ represents a current estimate of the value of the frequency, $x_1(K-1)T$ represents a previous estimate of the value of the frequency, $u(KT)+u(K-1)T$ represents the combined sample values of the signal, A represents $$A = \frac{1}{1 + \frac{T}{2}a + \left(\frac{T}{2}\omega_0(KT)\right)^2} \begin{bmatrix} 1 & -\frac{T}{2}\omega_0(KT) \\ \frac{T}{2}\omega_0(KT) & 1 + \frac{T}{2}a \end{bmatrix}$$

$$\begin{bmatrix} 1 - \frac{T}{2}a & -\frac{T}{2}\omega_0(K-1)T \\ \frac{T}{2}\omega_0(K-1)T & 1 \end{bmatrix}$$

and B represents $$B = \frac{1}{1 + \frac{2}{aT} + \frac{T}{2a}(\omega_0(KT))^2} \begin{bmatrix} 1 \\ \frac{T}{2}\omega_0(KT) \end{bmatrix}.$$

4. The method of claim 1, wherein determining the frequency comprises adding:
   a product of a first coefficient of a first matrix and a previous sample of a first estimated value of the reference signal;
   a product of a second coefficient of the first matrix and a previous sample of a second estimated value of the reference signal; and
   a product of a first coefficient of a second matrix and a signal value comprising the combined sampled values of the signal.

5. The method of claim 4, wherein determining the frequency comprises adding:
   a product of a third coefficient of the first matrix and the previous sample of the first estimated value;
   a product of a fourth coefficient of the first matrix and the previous sample of the second estimated value; and
   a product of a second coefficient of the second matrix and the signal value comprising the combined sampled values of the signal.

6. The method of claim 1, wherein the value of the frequency comprises an estimate of a current operating frequency of the electrical component.

7. The method of claim 1, wherein the time step is determined based upon a maximum anticipated operating frequency of the electrical component.

8. The method of claim 1, comprising selecting a bandwidth of frequency that corresponds to the reference frequency signal to determine the frequency.

9. The method of claim 1, comprising pre-warping the reference signal.

10. The method of claim 1, wherein the reference signal corresponds to a rate at which the second electrical component in the electrical system is operating.

* * * * *